United States Patent [19]

Henry

[11] 4,278,939

[45] Jul. 14, 1981

[54] ELECTROMAGNETIC ARRANGEMENT FOR MEASURING ELECTRICAL CURRENT

[75] Inventor: James L. Henry, Whippany, N.J.

[73] Assignee: Bell Telephone Laboratories, Incorporated, Murray Hill, N.J.

[21] Appl. No.: 61,463

[22] Filed: Jul. 27, 1979

[51] Int. Cl.³ .................. G01R 33/00; H04M 3/22
[52] U.S. Cl. ........................ 324/117 R; 179/18 FA; 361/45
[58] Field of Search .............. 324/117 R, 127, 244, 324/257, 260; 330/8; 179/18 FA; 361/45

[56] References Cited

U.S. PATENT DOCUMENTS

| 3,699,442 | 10/1972 | Riley ........................ 324/117 R |
| 4,118,597 | 10/1978 | Proctor et al. ............. 324/117 R |

*Primary Examiner*—Ernest F. Karlsen
*Attorney, Agent, or Firm*—Sherman N. Turner

[57] ABSTRACT

A line current measuring arrangement employs two separate toroidal cores with line windings and control windings. The line windings cause equal amounts of the same polarity of magnetizing intensity H in the cores when a line current flows. The control windings are pulsed by control signals to cause equal changes of opposite polarity of control H in the two cores to drive the two cores to opposite polarities of saturation of magnetic induction B. The same control windings also provide a succession of voltage pulses where the amplitudes and polarities of the pulses are measures of differences in the changes of B in the two cores. A succession of voltage pulses is cumulatively and algebraically integrated to provide a changing output voltage which is a measure of the cumulative integration. The output voltage is effective through the agency of the same control windings to cause feedback H in both cores in opposition to any line H. The output voltage becomes constant when the feedback H cancels the line H in the cores, whereupon the constant output voltage is a measure of any line current.

10 Claims, 2 Drawing Figures

ELECTROMAGNETIC ARRANGEMENT FOR MEASURING ELECTRICAL CURRENT

CROSS-REFERENCE TO RELATED APPLICATIONS

The present invention is an improvement on the invention disclosed and claimed in a U.S. application Ser. No. 061,464 of J. H. Condon for "Electromagnetic Arrangement for Measuring Electrical Current" filed on the same day as the present application.

Another improvement on the Condon invention is disclosed and claimed in a U.S. application Ser. No. 061,261 of J. C. Morriss for "Electromagnetic Arrangement for Measuring Electrical Current" filed on the same day as the present application.

TECHNICAL FIELD

The technical field of the present invention is generally the art of measuring electrical current and particularly the art of using electromagnetic technique to do so.

BACKGROUND OF THE INVENTION

The Condon arrangement provides two separate essentially matching toroidal magnetic cores with line circuit windings, control circuit windings, sense windings, and feedback windings. Line current flowing in the line windings causes in the two cores essentially equal amounts of the same polarity of line current magnetizing intensity H. A pulse of control current flowing in the control windings causes corresponding changes in the two cores of control current H where the changes of control H in the two cores are of essentially equal amounts of control H but of the opposite polarity. Each change of control H causes the magnetic inductions B in the two cores to undergo corresponding changes from an amount of one polarity of B corresponding to a zero amount of control H to B saturation of the same polarity of B and then from B saturation back to an amount of the same polarity of B corresponding to a zero amount of control H. These changes of B in the two cores occur along minor saturation hysteresis loops. The changes of B in the two cores produce induced voltages in the sense windings which are connected in series oppositon with regard to polarity of the induced voltages. With no line H present in the two cores, the output of the series connection of sense windings is essentially zero voltage since the changes of B in the two cores are essentially of equal amounts of opposite polarity. The presence in the two cores of line H, due to the flow of line current, causes the changes of B in the two cores to differ by an amount which is a measure of the amount and polarity of line H (and thus a measure of the amplitude and polarity of line current). Such a difference in the changes of B in the two cores produces a voltage pulse, the amplitude and polarity and duration of which are a measure of the difference between the amounts and polarities of the changes of B in the two cores. A succession of voltage pulses is cumulatively and algebraically integrated to provide a changing output voltage, the amplitude and polarity of which are a measure of the cumulative integation. The output voltage is used to cause in each core, by means of either the sense windings or the feedback windings, an amount of feedback H where the amount is according to the output voltage and the polarity opposes any line H in the two cores. The output voltage becomes essentially constant when the feedback H essentially cancels the line H in the two cores; and, the amplitude and polarity of the constant output voltage are a measure of the amplitude and polarity of line current.

While the Condon arrangement is quite satisfactory from an operational standpoint, it uses at least three sets of core windings to effect the three functions of line current coupling, control current pulse coupling, and sense voltage coupling. In one Condon arrangement the sense windings are used to effect the feedback function; whereas, in another Condon arrangement, a fourth set of core windings is used to effect the feedback function. It is considered advantageous to simplify the core winding situation in order not only to reduce costs but also to reduce the number and complexity of circuit and magnetic structure design considerations.

SUMMARY OF THE INVENTION

The present invention realizes the advantages of the Condon arrangement(s) but does so by using two separate magnetic paths as in Condon but by using only two electromagnetic coupling arrangements.

In general, according to the present invention, line circuit coupling means is employed to electromagnetically couple a line circuit to the two paths; and, control circuit coupling means is employed to electromagnetically couple a control circuit to the two paths. The control circuit coupling means is used for the three functions of the pulsing of control H, the production of B change voltage pulses, and the causing of feedback H.

In more particular, the line circuit coupling means comprises line winding means linking both paths; the control circuit coupling means comprises control winding means linking both paths; and the pulsing of control H, the production of voltage pulses, and the causing of feedback H are each performed by using the control winding means.

Specifically, the present invention uses a single separate control winding linking each separate path with circuitry associated with the control windings to perform the above-stated three functions of the pulsing of control H, the production of B change voltage pulses, and the causing of the feedback H.

More specific aspects of the present invention will be apparent from the subsequent detailed description of the exemplary embodiment and from the appended claims.

BRIEF DESCRIPTION OF THE DRAWING

The drawing consists of two sheets including two figures briefly described as follows.

DETAILED DESCRIPTION

Figure 1:
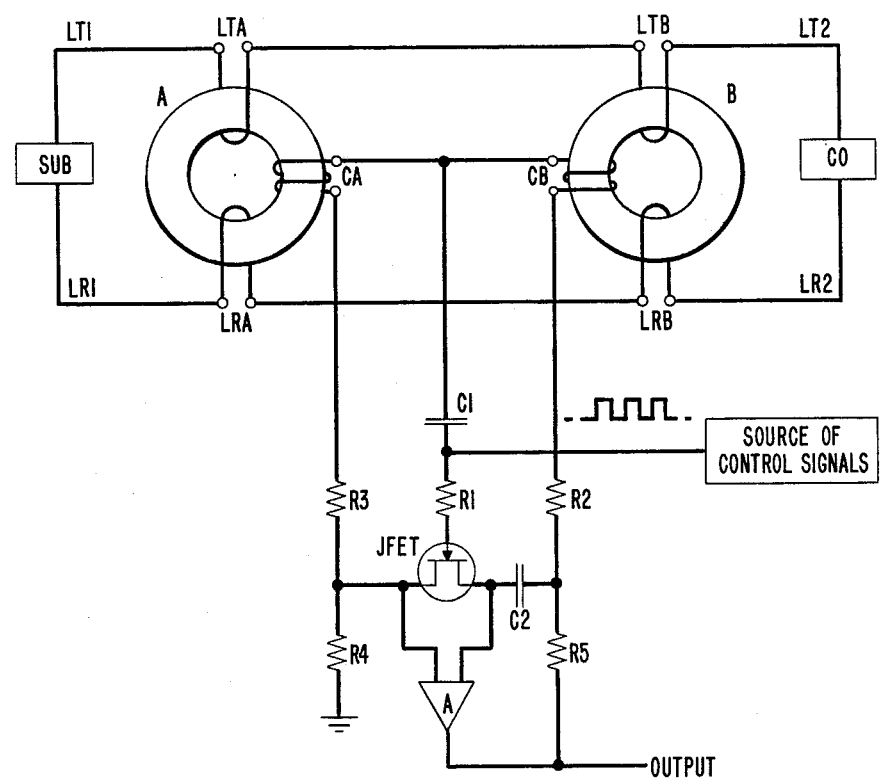
FIG. 1 is a schematic showing of a two-core arrangement.

FIG. 1 shows how two magnetic cores A and B may be connected to circuitry for measuring line current. The box "SUB" represents a telephone subscriber's station equipment. The box "CO" represents a telephone switching center, such as the usual central office. The subscriber's station is connected to the central office by way of a loop comprising the lines LT1, LT2, LR1 and LR2. Line windings LTA, LTB, LRA, and LRB link the two cores such that a direct current flowing in the entire loop produces in the two cores essentially equal amounts of the same polarity (such as clockwise in the cores of FIG. 1) of magnetizing intensity H. The pair of windings LTA and LRA (as well as the pair of windings ITB and LRB) are so related as to aid each other in producing in core A line H due to loop current; but, those windings of each pair are so related as to oppose each other in producing in cores A and B line H due to longitudinal current, such as current flowing in the same direction (right to left or left to right in FIG. 1) in either side or in both sides of the loop.

The cores A and B in FIG. 1 have essentially matching magnetic characteristics such that the slope of the hysteresis characteristic changes substantially as the magnetizing intensity H changes between a zero amount of H and a finite amount of H. Such cores may be of ferromagnetic material, such as ferrite. Each core is preferably a solid continuous core of toroidal shape.

There is a control winding CA or CB linking each core and connected to circuitry, as will be explained, whereby control current pulses may be caused to flow in both windings CA and CB in parallel. The control windings CA and CB are also connected to circuitry, as will be explained, whereby voltage pulses caused by changes of B in the cores may be detected and integrated in a cumulative algebraic manner to produce an output voltage which is a measure of any line current. The control windings CA and CB are also used as the means whereby the output voltage causes feedback H so as to cancel the line H in both cores.

It is to be noted that the control windings CA and CB are arranged on the respsective cores A and B so that a control current pulse of particular amplitude and polarity flowing in parallel, by way of capacitor C1 for example, through the windings CA and CB will produce essentially equal amounts of control H in the two cores but of opposite polarity (that is, for example, if the direction of control H in core A is clockwise, then the corresponding control H in core B will be counterclockwise). Thus, the control H in one core will aid the line H and the corresponding control H in the other core will oppose the line H.

In FIG. 1, the source of control signals provides a normally LOW (L) logic level at the junction of capacitor C1 and resistance R1. The L level is interrupted at a rate of the order of 10 KHz for about a 2 microsecond ($\mu$s) LOW-to-HIGH-to-LOW (L to H to L) pulse of about 12 volts amplitude. HIGH (H) and LOW (L) will be understood to means respective logic levels of about +12 volts direct current and ground potential (zero volts direct current).

Each L to H control signal is effective through capacitor C1 to cause a corresponding control current to flow in parallel through the control windings CA and CB as capacitor C1 acquires a charge due to the control signal. For example, a control current will flow from the top of capacitor C1, through winding CA, and to ground through resistances R3 and R4; whereas, a corresponding control current will flow from the top of capacitor C1, through winding CB, and through resistances R2 and R5 to the output of amplifier A (essential at ground potential, as will be explained, when the output of amplifier A is zero). These control currents flowing through windings CA and CB are essentially of the same amplitude, duration, and polarity; thus, each control current will cause the same amount of change of control H in the two cores but of opposite polarity of H.

At the end of each L to H control signal (that is, when it returns from H to L), the contol current in the two control windings CA and CB will cease to be supplied from the source of control signals through capacitor C1; and, the control current will gradually return toward zero as capacitor C1 gradually starts to discharge. However, the current in windings CA and CB actually passes through zero and increases in the opposite polarity (that is, with respect to its polarity during the control signal H) due to the fact that capacitor C1 will discharge. When capacitor C1 is essentially fully discharged, the current in control windings CA and CB will again become zero.

Figure 2:
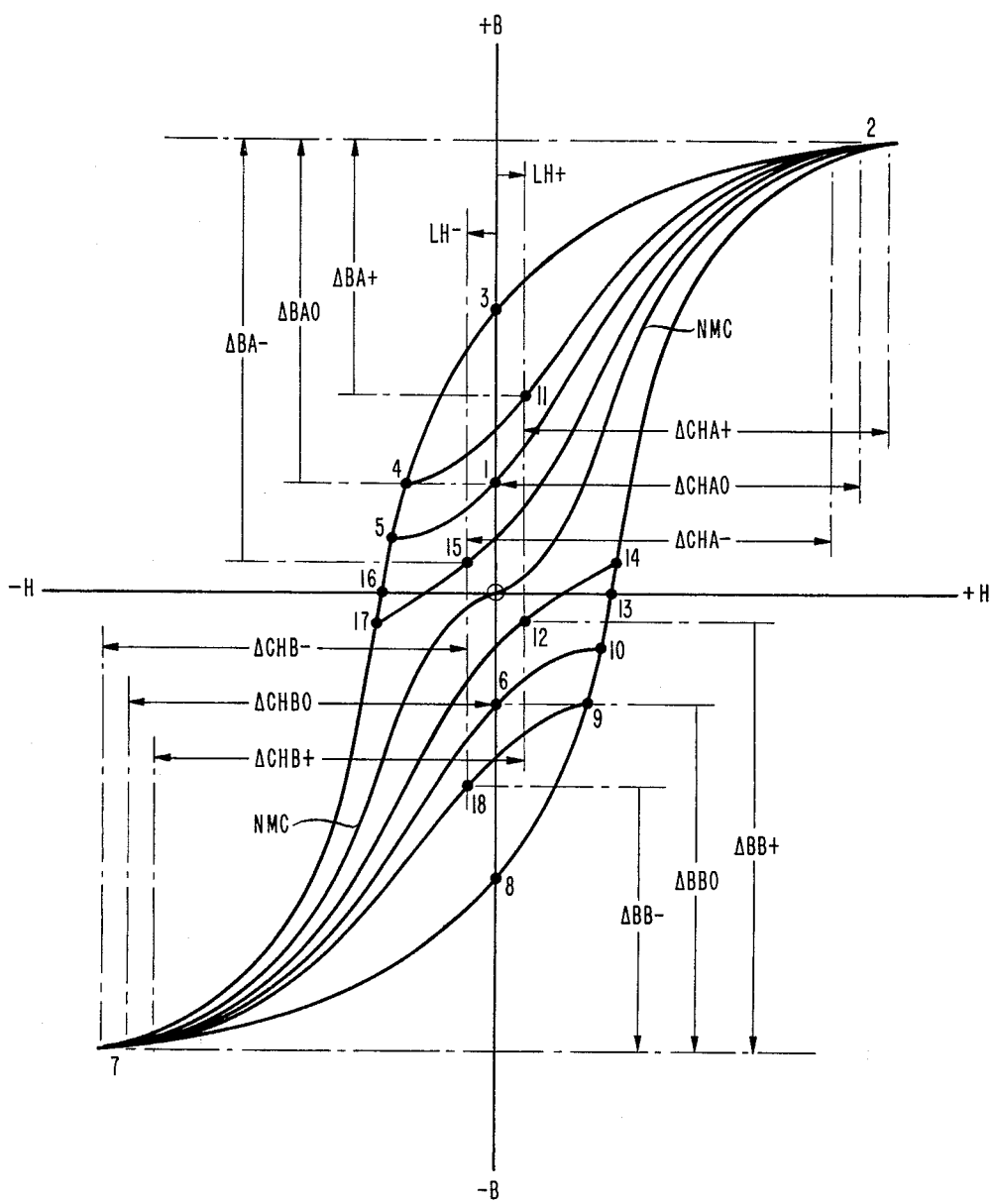
FIG. 2 is a representation of static hysteresis characteristics of the cores with notations useful in explaining the dynamic functioning thereof.

The above control current pulse sequence may be understood in connection with FIG. 2.

FIG. 2 shows the major saturation hysteresis characteristic 3, 4, 5, 16, 17, 7, 8, 9, 10, 13, 14, 2, and 3 of the core material. As is well known in the art, the major saturation hysteresis characteristic may also be referred to as the major saturation hysteresis curve or loop. The curve NMC will be recognized as the normal magnetization curve. The upper half of FIG. 2 is useful in understanding what likely happens in core A; and, the lower half of FIG. 2 is useful in understanding what likely happens in core B since the control current pulses in cores A and B are of opposite effect in the respective cores.

It is now assumed that no line current is flowing in the line circuit of FIG 1. The control current pulses through windings CA and CB are assumed to be sufficient to drive the cores essentially into B saturation such as point 2 in FIG. 2 for core A and such as point 7 in FIG. 2 for core B. At the end of each control signal, the cores A and B start to collapse from 2 to 3 and from 7 to 8. Each core will continue beyond the amount of B corresponding to zero control H in order for capacitor C1 to become discharged. Thus, core A will continue in FIG. 2 from 3 to another point, such as 5, and then to point 1, where the control H is zero. Also, core B will continue in FIG. 2 from 8 to another point, such as 10, and then to point 6 where the control H is zero. It is not known exactly where on the zero H axis the cores actually come to rest, so to speak. For example, for core A such a point may be other than point 1; but, the exact sitatuion is not important, as will be seen. It will be assumed, for illustrative purposes, that core A comes to rest at point 1 and that core B comes to rest at point 6.

Under the above-described conditions (that is, no line current in FIG. 1), the changes in magnetizing intensity H in cores A and B are shown in FIG. 2 as $\Delta$CHA0 and $\Delta$CHB0 of equal amount and of opposite polarity. As the cores A and B are driven essentially into B saturation by the control current pulses, the corrsponding changes of B in the cores are shown in FIG. 2 as $\Delta$BA0 and $\Delta$BB0 of equal amount and of opposite polarity. In later discussion of the circuitry associated in FIG. 1 with the JFET, the capacitor C2 and the amplifier A, it will be seen how the $\Delta$BA and $\Delta$BB changes in FIG. 2 are used to produce a meaningful output. Thus, in FIG. 2 the other changes of B are not indicated by any markings. However, in FIG. 2 it will be appreciated that the B in each core collapses from saturation to an amount of B corresponding to zero control H but experiences a swing into a region of reverse polarity of H. For example, as has been mentioned, the capacitor C1 must become discharged; and, the parts of FIG. 2 represented by the curve from 3 to 4 to 5 to 1 and from 8 to 9 to 10 to 6 suggest what may be happening in the cores during the discharge of capacitor C1. In the above example, where no line current is flowing in FIG. 1, it is seen that in FIG. 2 ΔBAO and ΔBBO are changes of equal amounts and of opposite polarities of the B in the two cores.

If it now be assumed in FIG. 1 that a line current of particular amplitude and polarity is flowing in the line loop, the dynamics of FIG. 2 change to the effect that the difference is no longer zero between the two opposite polarity changes of B in the two cores as they are driven into saturation. The notation LH+ in FIG. 2 signifies the presence in the two cores of an amount and polarity of magnetizing intensity H due to the line current. LH− signifies a similar amplitude of line current of the opposite polarity. For the LH+ situation, core A will come to rest at some point, such as 11, corresponding to a zero amount of control H; and, core B will have a similar rest point, such as point 12. The cores are driven into saturation by the respective changes of H shown as ΔCHA+ and ΔCHB+. The resulting changes of B in the cores are ΔBA+ and ΔBB+. The latter changes of B in the two cores are seen to be of different amounts but still of opposite polarity. Thus, a net change of B results where the amount of that net change and its polarity are a measure of the line current. By the same token, a reverse polarity line current in FIG. 1, such as LH− in FIG. 2, would have produced a rest point in core A, such as point 15, and a rest point in core B, such as point 18. The corresponding changes of control H, ΔCHA− and ΔCHB−, would produce the corresponding changes of B, ΔBA− and ΔBB−, to in turn provide a net change of B in the opposite polarity to that of LH+ above discussed.

During the foregoing dynamic action of the two cores under the assumed conditions of no line current and of equal amounts of line current of opposite polarity, only one control signal and only one control current pulse in each control winding CA and CB have been considered. It is now considered helpful to understand what occurs in the rest of the circuit of FIG. 1 as a result of these single control signal situations.

For zero line current in FIG. 1, the changes of B in the two cores, due to a control signal having caused a control current pulse in each of the control windings CA and CB, are equal and opposite. As a result, the corresponding voltages at the tops of resistances R4 and R5 during the two equal changes of B are essentially equal and of the same polarity. The control signal (H) which caused these voltages at the tops of resistances R4 and R5 caused the junction field effect transistor JFET to become fully conducting so that the difference, if any, of voltage from the top of resistance R4 to the top of resistance R5 is applied through the conducting JFET to the capacitor C2. In this instance, no voltage is applied across capacitor C2 and capacitor C2 acquires no charge. When the control pulse returns to L, the JFET is turned off so that the capacitor C2 is not affected by the discharge of capacitor C1 as the two cores return to their rest points. A sucession of control current pulses will cause a succession of such circuit actions, resulting in zero charge on capacitor C2 and zero output from amplifier A. In the latter regard, the amplifier A and capacitor C2 are in a negative feedback amplifier configuration whereunder the output of amplifier A will become a changing output voltage which is a measure of a cumulative algebraic integration of the amplitude and polarity and duration of voltage pulse inputs to the amplifier A. Where, as above discussed, no voltage pulse inputs are applied to amplifier A and no charge is accumulated in capacitor C2, the output of amplifier A will remain essentially at ground potential (that is, zero amplitude of voltage).

If a line current is assumed to be flowing in FIG. 1 so as to cause an amount LH+ of line H in FIG. 2, the changes of B in the two cores will be of different amounts as the two cores are driven to B saturation during each control current pulse. Consequently, during the time that the JFET in FIG. 1 is turned on, capacitor C2 will acquire a charge of proper polarity according to the polarity difference in voltage from the top of resistance R4 to the top of resistance R5. Before the next control signal occurs, amplifier A will algebraically integrate that voltage pulse across its input terminals and will provide an increment of output voltage which is a measure of that integration. The polarity of the output voltage of the amplifier is the inverse of the input and is such as to cause in the windings CA and CB an increment of feedback H in each core in opposition to the line H. A succession of control pulses will cause the amplifier A to cumulatively and algebraically integrate the corresponding successive voltage pulses across capacitor C2. The cumulative integration will experience voltage pulses across capacitor C2 of less and less amplitude as the changing output voltage of amplifier A gradually causes the feedback H to cancel the line H in the two cores. The final charge on C2 stabilizes at a value where the output of amplifier A produces enough feedback current in windings CA and CB to cancel the effect of the line current and where the input to amplifier A is of that amount required to generate the feedback current. Should the output of the amplifier A deviate from that required value, the charge on capacitor C2 will change in the direction necessary to correct the error.

If a line current is assumed in FIG. 1 such as to cause a LH− in FIG. 2, it will be apparent that the amplifier A and capacitor C2 configuration will stabilize at an amplitude and polarity of output voltage which are a measure of that reversed polarity of line current.

The curves in FIG. 2 used to explain the dynamics of the core actions are minor hysteresis loops such as the loop 1, 2, 3, 4, 5, 1 and such as the loop 6, 7, 8, 9, 10, 6, especially minor saturation hysteresis loops. As mentioned earlier, it is not certain exactly how a core returns from saturation to its rest point. It is apparent that the major saturation hysteresis loop will be followed from saturation such as point 2 down to a point such as 3 where the magnetizing intensity is zero. It is also apparent that from point 3 the core will continue to some point such as 4 or 5 or 16 or 17, et cetera and then back to some point such as 15 or 1 or 11, et cetera as the rest point. It will now also be apparent that knowing exactly what happens is not of consequence since the collapse from saturation to the rest point is not used as the measurement mechanism in the preferred embodiment.

Typical parameters in FIG. 1 are as follows: Windings LTA, LTB, LRA and LRB are single-turn windings; windings CA and CB are 50-turn windings; capacitor C1 is 0.1 microfarads ($\mu f$); capacitor C2 is 0.01 $\mu f$; resistance R1 is 47,000 ohms; resistances R2 and R3 are 475 ohms each; and, resistances R4 and R5 are 100 ohms each.

It is to be understood that the above-described arrangement is illustrative of the application of the principles of the invention. Other arrangements may be devised by those skilled in the art without departing from the spirit and scope of the invention. For example, while direct current line current has been assumed as an example, it will be obvious that the invention may be used to measure alternating line currents provided the frequency of the control signals is high enough relative to the frequency of line current so that enough increments or samples of the line current envelope are secured so that the integrated output of amplifier A is a fair representation of the changing amplitude and polarity of the line current. Also, while solid continuous toroidal cores of ferrite have been used in the preferred embodiment, it will be apparent that any reentrant magnetic paths of low reluctance may be used. In addition, while the preferred embodiment uses minor saturation hysteresis loops, it is quite apparent that minor hysteresis loops of other major hysteresis loops could be used so long as detectable differences are realized between the B changes in the two cores. Also, while in the preferred embodiment the build-ups of B have been used as the mechanism for deriving the voltage pulses, it is entirely conceivable that part or all of the collapses might be used for the same purpose along with suitable changes in the JFET control arrangement. In addition, it will be quite apparent that line current other than in a telephone system may be measured by the use of the invention.

I claim:

1. An arrangement for measuring an electrical line current flowing in a line circuit comprising:
   (A) two separate magnetic paths having essentially matching magnetic characteristics such that the slope of the hysteresis characteristic changes substantially as the magnetizing intensity H changes between a zero amount of H and a finite amount of H;
   (B) means electromagnetically coupling the line circuit to the two paths so that a particular amplitude and polarity of line current causes in the two paths corresponding essentially equal finite amounts of the same polarity of line H;
   (C) means for supplying a succession of control signals;
   (D) a control circuit controlled by each control signal so that a corresponding pulse of particular amplitude and duration and polarity of control current flows in the control circuit;
   (E) means electromagnetically coupling the control circuit to the two paths so that each control current pulse causes in the two paths coresponding changes of control H where the changes of control H are of essentially equal finite amounts of the opposite polarity;
   (F) each change of control H in the two paths being such as to cause the magnetic inductions B in the two paths to undergo corresponding changes of opposite polarity where the amounts and polarities of the changes of B are determined by the combined amount and polarity of line H and control H in the two paths;
   (G) means including the control circuit coupling means controlled by each control signal and by the corresponding changes of B in the two paths to produce a corresponding voltage pulse the amplitude and duration and polarity of which are a measure of any algebraic difference between the amounts of the corresponding changes of B in the two paths;
   (H) means controlled by a plurality of successive voltage pulses
      (1) to perform cumulative algebraic integration of the successive voltage pulses
      (2) and to provide a changing output voltage the amplitude and polarity of which are a measure of the cumulative integration;
   (I) and, means including the control circuit coupling means controlled by the output voltage to cause in the two paths essentially equal amounts of feedback H where
      (1) the amount of feedback H is according to the amplitude of the output voltage
      (2) and the polarity of the feedback H is opposite to the polarity of any line H;
   (J) whereby
      (1) the amplitude of the output voltage becomes essentially constant when in each of the two paths the amount of feedback H essentially equals the amount of line H
      (2) and the amplitude and polarity of the constant output voltage are a measure of the amplitude and polarity of the line current.

2. The invention defined in claim 1 wherein:
   (A) each change of B in each of the two paths comprises
      (1) a first type of change occurring at the start of the corresponding control current pulse when B changes from an amount of B corresponding to a zero amount of control H to another amount of B
      (2) and a second type of change occurring at the end of the corresponding control current pulse when B changes from the said other amount of B to an amount of B corresponding to a zero amount of control H;
   (B) and, the voltage pulse producing means is controlled by the same type of changes of B.

3. The invention defined in claim 2 wherein the voltage pulse producing means is controlled by only the first type of changes of B.

4. The invention defined in claim 3 wherein the changes of B are along minor hysteresis loops.

5. The invention defined in claim 4 wherein the minor hysteresis loops are minor saturation hysteresis loops.

6. The invention defined in claim 1 or 2 or 3 or 4 or 5 wherein:
   (A) the line circuit coupling means comprises line winding means linking the two paths;
   (B) the control circuit coupling means comprises control winding means linking the two paths in addition to the line winding means;
   (C) and, the voltage pulse producing means and the feedback H causing means include the control winding means.

7. The invention defined in claim 6 wherein the control winding means comprises separate winding means linking each separate path.

8. The invention defined in claim 7 wherein the two separate paths are two separate reentrant low-reluctance magnetic paths.

9. The invention defined in claim 8 wherein each path is a continuous solid magnetic core.

10. The invention defined in claim 9 wherein each core is of toroidal shape.

* * * * *